(12) United States Patent
Medvedeva et al.

(10) Patent No.: US 7,039,896 B2
(45) Date of Patent: May 2, 2006

(54) GRADIENT METHOD OF MASK EDGE CORRECTION

(75) Inventors: Marina M. Medvedeva, Moscow (RU); Stanislav V. Aleshin, Moscow (RU); Eugeni E. Egorov, Moscow (RU); Sergei B. Rodin, Moscow (RU)

(73) Assignee: LSI Logic Corporation, Milpitas, CA (US)

( * ) Notice: Subject to any disclaimer, the term of this patent is extended or adjusted under 35 U.S.C. 154(b) by 259 days.

(21) Appl. No.: 10/740,359

(22) Filed: Dec. 18, 2003

(65) Prior Publication Data

US 2005/0138596 A1 Jun. 23, 2005

(51) Int. Cl.
*G06F 17/50* (2006.01)

(52) U.S. Cl. ............................................. 716/19; 716/21

(58) Field of Classification Search ............ 716/19–21; 430/5, 22
See application file for complete search history.

(56) References Cited

U.S. PATENT DOCUMENTS

| | | | |
|---|---|---|---|
| 6,269,472 B1 | 7/2001 | Garza et al. | 716/21 |
| 6,611,953 B1 * | 8/2003 | Filseth et al. | 716/19 |
| 6,813,757 B1 * | 11/2004 | Aton et al. | 716/19 |
| 6,928,634 B1 * | 8/2005 | Granik et al. | 716/19 |
| 2004/0015808 A1 * | 1/2004 | Pang et al. | 716/19 |
| 2005/0015233 A1 * | 1/2005 | Gordon | 703/13 |

* cited by examiner

*Primary Examiner*—Matthew Smith
*Assistant Examiner*—Binh Tat
(74) *Attorney, Agent, or Firm*—Suiter West Swantz PC LLC

(57) ABSTRACT

The present invention is directed to a method and apparatus for making mask edge corrections using a gradient method for high density chip designs. The present invention uses a newly defined cost function.

24 Claims, 3 Drawing Sheets

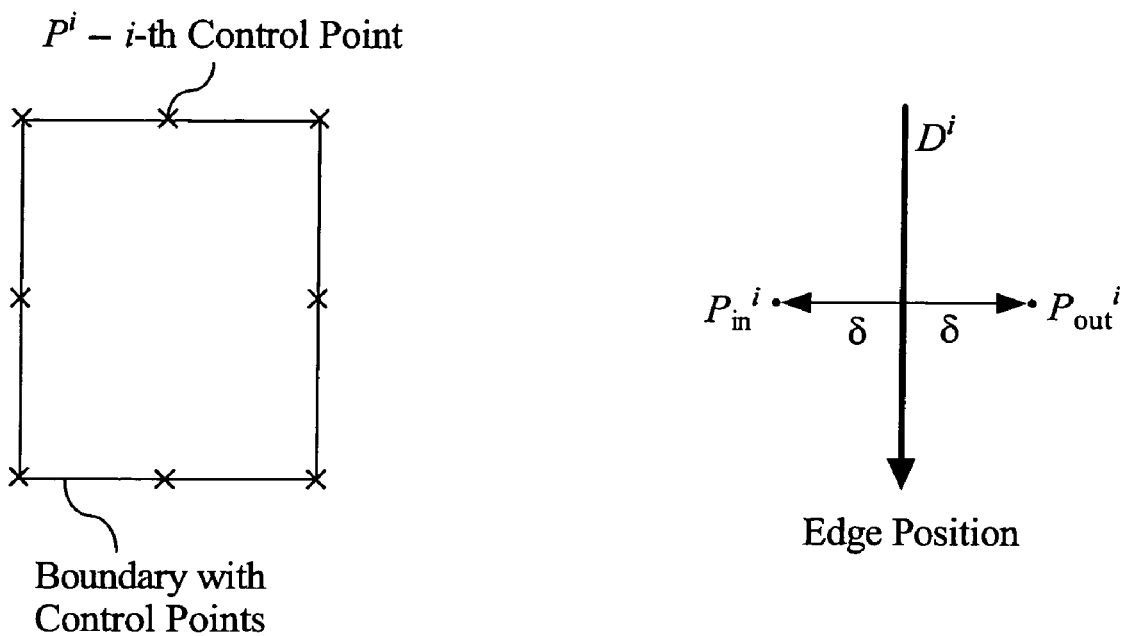
*FIG. 2A*  *FIG. 2B*
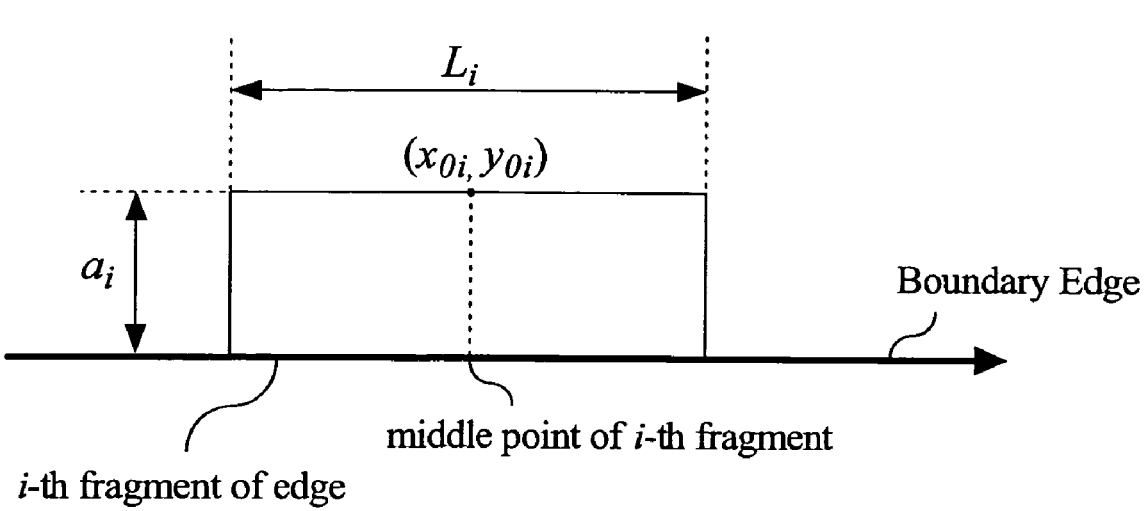
*FIG. 4*

GRADIENT METHOD OF MASK EDGE CORRECTION

CROSS-REFERENCE TO RELATED DOCUMENTS

The present application herein incorporates the following by reference in their entirety: (1) U.S. patent application Ser. No. 09/879,664, entitled "Mask Correction for Photolithographic Processes", filed Jun. 12, 2001; (2) N. Cobb and A. Zakhor, "Fast, Low-Complexity Mask Design," in *Proceedings of the SPIE Symposium on Optical Microlithography*, Santa Clara, Calif., February 1995, vol. 2440, pp. 313–327; and (3) N. Cobb, "Fast Optical and Process Proximity Correction Algorithms for Integrated Circuit Manufacturing," Ph.D. Thesis, Department of Electrical Engineering and Computer Sciences, University of California at Berkeley, May 1998.

FIELD OF THE INVENTION

The present invention generally relates to the field of integrated circuits, and particularly to a method and apparatus for making mask edge corrections using a gradient method.

BACKGROUND OF THE INVENTION

With the advance of technology in integrated circuits (ICs), the minimum feature sizes of ICs have been shrinking for years. Commensurate with this size reduction, various process limitations have made IC fabrication more difficult. One area of fabrication technology in which such limitations have appeared is photolithography. Photolithography involves selectively exposing regions of a resist coated silicon wafer to a radiation pattern, and then developing the exposed resist in order to selectively protect regions of wafer layers (e.g., regions of substrate, polysilicon, or dielectric).

An integral component of a photolithographic apparatus is a "reticle" or "mask" which includes a pattern corresponding to features at one layer in an IC design. Such a mask may typically include a transparent glass plate covered with a patterned light blocking material such as chromium. The mask may be placed between a radiation source producing radiation of a pre-selected wavelength and a focusing lens which may form part of a "stepper" apparatus. Placed beneath the stepper may be a resist covered silicon wafer. When the radiation from the radiation source is directed onto the mask, light may pass through the glass (regions not having chromium patterns) and project onto the resist covered silicon wafer. In this manner, an image of the mask may be transferred to the resist. The resist (sometimes referred to as a "photoresist") is provided as a thin layer of radiation-sensitive material that is spin-coated over the entire silicon wafer surface.

As light passes through the mask, the light may be refracted and scattered by the chromium edges. This may cause the projected image to exhibit some rounding and other optical distortion. While such effects pose relatively little difficulty in layouts with large feature sizes (e.g., layouts with critical dimensions above about 1 micron), the effects may not be ignored in layouts having features smaller than about 1 micron. The problems become especially pronounced in IC designs having feature sizes near the wavelength of light used in the photolithographic process. Optical distortions commonly encountered in photolithography may include rounded corners, reduced feature widths, fusion of dense features, shifting of line segment positions, and the like. Unfortunately, any distorted illumination pattern may propagate to a developed resist pattern and ultimately to IC features such as polysilicon gate regions, vias in dielectrics, and the like. As a result, the IC performance may be degraded or the IC may become unusable.

To remedy this problem, a mask correction technique known as optical proximity correction ("OPC") has been developed. OPC may involve adding regions to and/or subtracting regions from a mask design at locations chosen to overcome the distorting effects of diffraction and scattering. Manual OPC has been in existence for many years. Using manual OPC, an engineer may need to add regions using trial and error techniques until the desired pattern on the wafer is obtained. While manual OPC has been effective, as the dimensions of critical features shrink, it has become apparent that the manual approach is not time/cost effective. Therefore, a systematic way is needed to enable fast processing of large, complex chips. Generally speaking, there are currently two automated approaches to OPC: (1) rule-based OPC (use geometric rules to add corrections); and (2) model-based OPC (use lithography simulations to decide corrections). Rule-based OPC is an extension of the methods used for manual OPC. Through experiment or simulation, the corrections that should be applied in a given geometrical situation may be discovered. Then, a pattern recognition system may be used to apply the corrections wherever that geometrical situation occurs throughout the entire layout design. While rule-based OPC is fast and can be applied to an entire layout, rule-based OPC is not as accurate as desired because rule-based OPC is not directly based on lithography simulation. Model-based OPC is different from rule-based OPC in that simulation models are used to compute the wafer results and modify edges on the mask to improve the simulated wafer results. Model-based OPC may be capable of more general corrections, but may require longer OPC time since simulation is typically time-intensive. The use of lithography simulation has been traditionally for analysis of aerial images and cutlines. The aerial image has long been used as a first order approximation to the final etched features produced by photolithography. Presently the role of lithography simulation has been broadened to include use of simulation within mask design synthesis tools.

A high density chip design is a chip design that has a distance of less than $0.8\lambda$ among input design boundaries, where $\lambda$ is the wavelength of the light source. Model-based OPC of such a design often leads to a chip design with even higher density, because the movement of fragmentation regions of the edge (edge correction) may be essential (typically in the range of $0.3$–$0.4\lambda$). The light intensity (or intensity) information alone may be not enough for the OPC of a high density chip design, since for such a design there is no single-value conformity between the edge corrector value change and the position of the process light intensity contour relative to the mask edge. The intensity value at a certain point may depend on the set of edge correctors at the influence region surrounding this point. Thus, the movement of all these correctors need be coordinated.

Therefore, it would be desirable to provide a method and apparatus for making mask edge corrections using a gradient method for high density chip designs.

SUMMARY OF THE INVENTION

Accordingly, the present invention is directed to a method and apparatus for making mask edge corrections using a gradient method for high density chip designs. In an exemplary aspect of the present invention, a method for making mask edge corrections may include the following steps: (a) providing parameter initial values and calibration values; (b) performing coherent field calculation; (c) performing process intensity calculation; and (d) calculating a cost function, the cost function being defined as $$\Phi = \sum_i \Phi_i^2, \text{ wherein}$$

$$\Phi_i = \begin{cases} (J_{in}^i - C_{in}^0), & \text{if } J_{in}^i < C_{in}^0 \\ (J_{out}^i - C_{out}^0), & \text{if } J_{out}^i > C_{out}^0 \quad \text{for dark background; and} \\ 0, & \text{in other cases} \end{cases}$$

$$\Phi_i = \begin{cases} (J_{in}^i - C_{out}^0), & \text{if } J_{in}^i > C_{out}^0 \\ (J_{out}^i - C_{in}^0), & \text{if } J_{out}^i < C_{in}^0 \quad \text{for clear background;} \\ 0, & \text{in other cases} \end{cases}$$

where $J_{in}^i$ and $J_{out}^i$ are process intensity values at points $P_{in}^i$ and $P_{out}^i$, respectively, and $C_{out}^0 \leq C^0 \leq C_{in}^0$, $C^0$ being a cutline of a process intensity or aerial image contour, and $C^{out0}$ and $C_{in}^0$ being some cutlines of the process intensity, which characterize an intensity gradient near the aerial image contour.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIGS. 2–4 are illustrations useful in explaining the steps illustrated in FIG. 1.

DETAILED DESCRIPTION OF THE INVENTION

Reference will now be made in detail to the presently preferred embodiments of the invention, examples of which are illustrated in the accompanying drawings.

Figure 1:
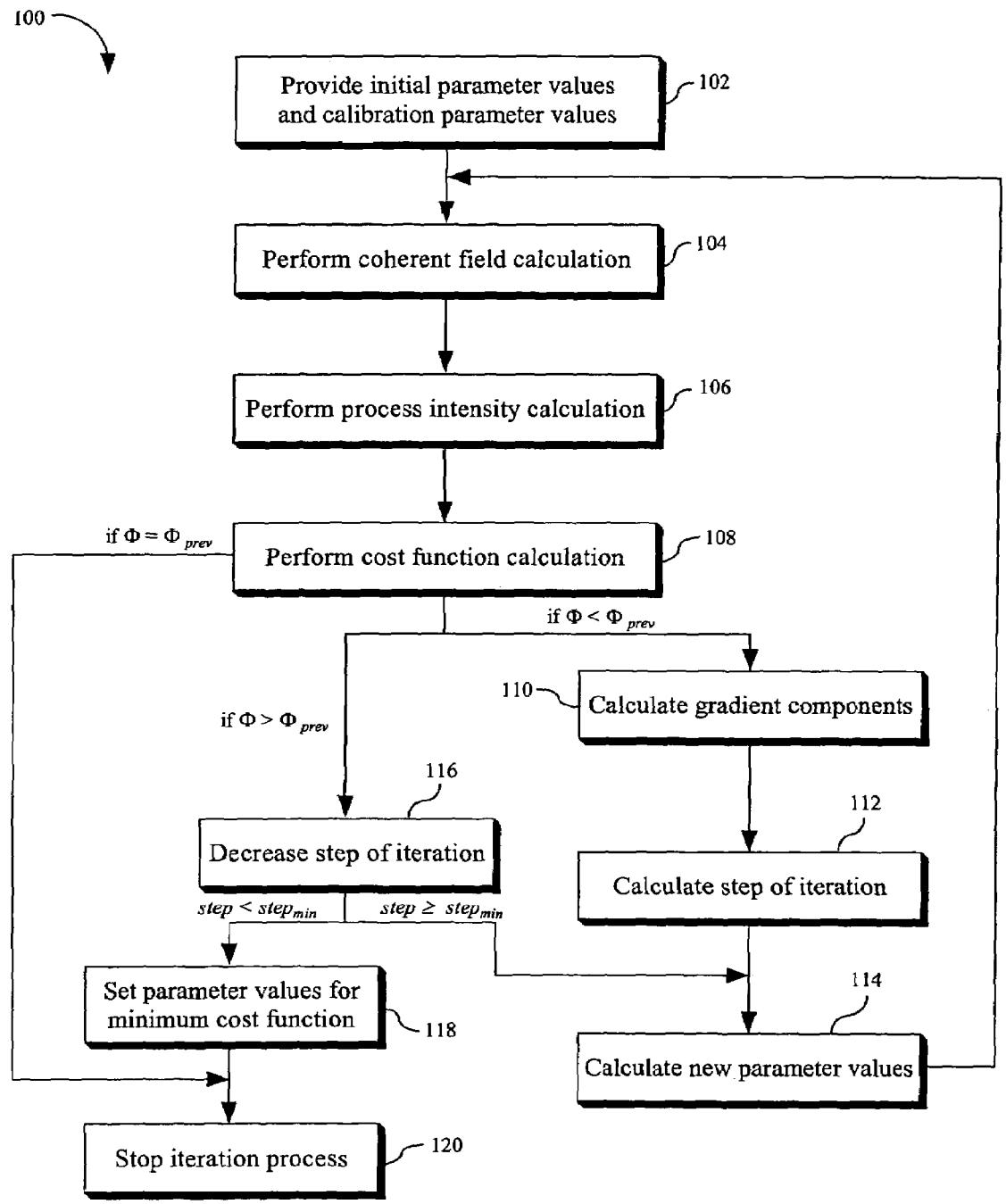
FIG. 1 illustrates a flowchart showing an exemplary method for making mask edge corrections using a gradient method in accordance with the present invention.

Referring first to FIG. 1, a flowchart showing an exemplary method or process 100 for making mask edge corrections using a gradient method in accordance with the present invention is shown. The process 100 may start with step 102 in which initial parameter values and calibration parameter values may be provided. The calibration parameter may include the model parameter such as stepper numerical aperture (NA), defocus def, source coherent degree, cutline of an intensity function, and the like. The initial values of the boundary edge regions may be set from the rools tables, calculated for the set of calibration parameters.

A coherent field calculation may be performed 104. For example, a coherent field may be calculated as:

$$E(x, y, x_u, y_u, \vec{a}) = \int\int d\xi d\eta H\left(\sqrt{(\zeta + \sigma x_u)^2 + (\eta + \sigma y_u)^2}\right) F_v$$

$$\left\{\frac{M \cdot NA}{\lambda}\xi, \frac{M \cdot NA}{\lambda}\eta, \vec{a}\right\} \exp\left\{i2\pi\frac{NA}{\lambda}(x \cdot \xi + y \cdot \eta)\right\},$$

where $$H(\rho) = ci\!r\!c(\rho)\sqrt[4]{\frac{1 - (M \cdot NA)^2 \cdot \rho^2}{1 - NA^2 \rho^2}} \exp\left\{i2\pi\frac{def}{\lambda}\sqrt{1 - NA^2\rho^2}\right\}$$

is the transmission function of the optical system for coherent source;

$$ci\!r\!c(\rho) = \begin{cases} 1 & \rho \leq 1 \\ 0 & \rho > 1; \end{cases}$$

def is defocus; $\lambda$ is the wavelength; $\sigma$ is the coherent degree; and $$F_v(x,y) = \int\int dx_m dy_m U(x_m, y_m)\exp\{-i2\pi(x_m x + y_m y)\}$$

is Fourier transform of the mask missing function.

A process intensity calculation may be performed 106. For example, the process intensity calculation may be performed as:

$$I(x, y, \vec{a}) = \frac{1}{I_0}\int\int J(x_u, y_u)|E(x, y, x_u, y_u, \vec{a})|^2 dx_u dy_u$$

where $I_0$ is open frame intensity; and $$J(x_u, y_u)$$

is the intensity distribution at the source surface.

Next, a cost function (or error function) calculation may be performed 108. The present invention introduces a new cost function for OPC purposes. There may exist two curves: one is the contour of the ideal image, which is equal to the input boundary, and the other is the real process intensity contour $C^0$ (some cut line of intensity function). Some control points may be defined at a boundary edge $D^i$, i=0, 1, 2 ... (see, e.g., FIG. 2A), and each of these control points may be moved perpendicular to the edge $D^i$ at a distance $\delta$ either inside the boundary or outside the boundary (see, e.g., FIG. 2B). Thus, two sets of points may be obtained: $P_{in}^i$ (inside the boundary) and $P_{out}^i$ (outside the boundary). The present cost function may take the following form:

$$\Phi = \sum_i \Phi_i^2 \qquad (*)$$

where $$\Phi_i = \begin{cases} (J_{in}^i - C_{in}^0), & \text{if } J_{in}^i < C_{in}^0 \\ (J_{out}^i - C_{out}^0), & \text{if } J_{out}^i > C_{out}^0 \quad \text{for dark background; and} \\ 0, & \text{in other cases} \end{cases}$$

-continued $$\Phi_i = \begin{cases} (J_{in}^i - C_{out}^0), & \text{if } J_{in}^i > C_{out}^0 \\ (J_{out}^i - C_{in}^0), & \text{if } J_{out}^i < C_{in}^0 \\ 0, & \text{in other cases} \end{cases} \quad \text{for clear background;}$$

where $J_{in}^i$ and $J_{out}^i$ are the process intensity values at the points $P_{in}^i$ and $P_{out}^i$, respectively and $C_{out}^0 \leq C^0 \leq C_{in}^0$, $C^0$ being a cutline of the process intensity or aerial image contour, $C_{out}^0$ and $C_{in}^0$ being some cutlines of process intensity, which characterize the intensity gradient near the aerial image contour.

Figure 3:
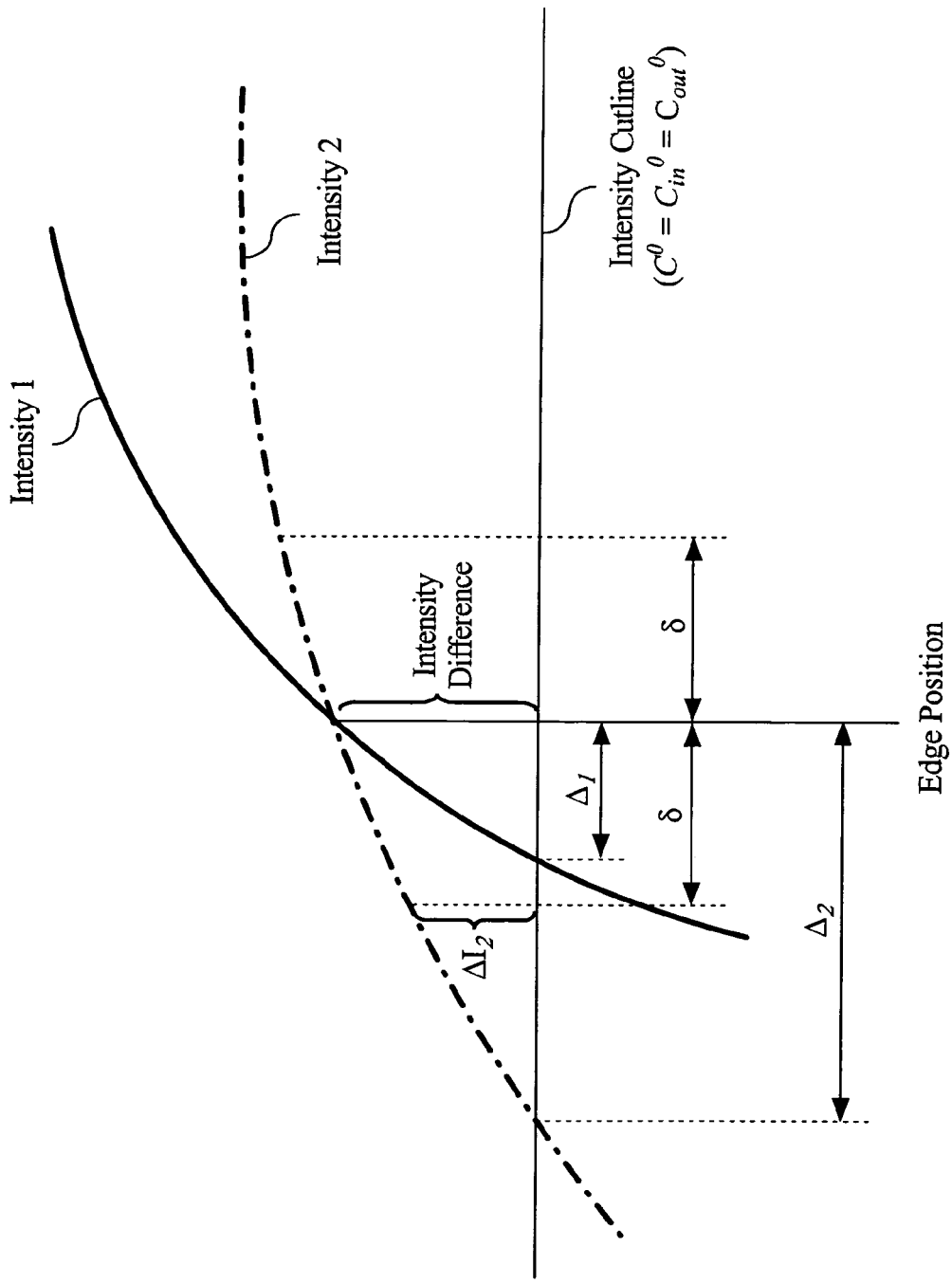

Those of ordinary skill in the art will understand that the present cost function differs from the generally used cost function, which is the 2-norm between the process intensity value and the desired intensity value at a finite number of sample points along the boundary edge (see, e.g., N. Cobb and A. Zakhor, "Fast, Low-Complexity Mask Design," in *Proceedings of the SPIE Symposium on Optical Microlithography*, Santa Clara, Calif., February 1995, vol. 2440, pp. 313–327). The generally used cost function may not reflect the difference between contours because the same intensity difference may have the small difference between contours (when the intensity gradient is large), or large difference between contours (when the intensity gradient is small). For example, as shown in FIG. 3, Intensity 1 with the large intensity gradient and Intensity 2 with the small intensity gradient both have the same intensity value at the edge position. However, the difference $\Delta_1$ between contours for Intensity 1 is rather smaller than $\Delta_2$ for Intensity 2 while the differences between process intensity values are the same. Therefore, while the generally used cost function gives the same value for both Intensity 1 and Intensity 2, the present cost function gives for Intensity 1 $\Phi=0$, and for Intensity 2 $\Phi=(\Delta_2)^2$. The value $\delta$ may be preferably chosen in conformity to the CD (critical dimension) tolerance for design correction.

For minimizing a digital solution of the cost function $\Phi(\vec{a})$, one may build the consistent approximation for parameters vector $\vec{a}$:

$$\vec{a}^{[l+1]} = \vec{a}^{[l]} + \lambda^{[l]} \vec{v}[l], l=0,1,2,\ldots$$

which may coincide to the solution $\vec{a}_0$ when $l$ comes to infinity. For a method of quickest lowering i- component of vector $\vec{v}[l]$ is the gradient component of function $\Phi(\vec{a})$. For the i-coordinate $a_i$:

$$V_i[l] = \frac{\partial}{\partial a_i} \Phi(\vec{a}) \bigg|_{\vec{a}=\vec{a}^{[l]}} \quad (**)$$

The gradient component () may be calculated in step 110 when the cost function for the new $\vec{a}^{[l+1]}$ decreases. Additionally, the step 110 may be performed simultaneously with the step 106 (the intensity calculation process), using the coherent field values obtained in the step 104** for different light source points.

From the equation (*), one may see that the i-th gradient component for l-stage of iteration process may be represented as follows:

$$\frac{\partial}{\partial a_i} \Phi(\vec{a}) \bigg|_{\vec{a}=\vec{a}^{[l]}} = 2 \sum_j (J_j - C_j) \frac{\partial J_j}{\partial a_i} \bigg|_{\vec{a}=\vec{a}^{[l]}}$$

where $J_j = \{J_{in}^i \text{ or } J_{out}^j\}$ is the process intensity value, corresponding to the j control point, and $$\frac{\partial J_j}{\partial a_i}$$

is the first derivative of the process intensity $J_j$ for the parameter component $a_i$.

According to the present correction procedure, the regions of boundary edges are moved only normal to the initial edge position. In such a cases, as shown in FIG. 4, each moving fragment i of the boundary edge may form a rectangular with a length $L_i$ and a height $a_i$, where $L_i$ is the length of the i-th edge fragment.

When the size of such a rectangles is smaller than the optical resolution limit $$\frac{\lambda}{NA}$$

($\lambda$ is the wavelength of the light source, and NA is the numerical aperture of the projection lens used in projecting the reticle image onto the wafer), the present invention uses the following expression for the first derivative of intensity for the parameter vector component $a_i$:

$$\frac{\partial J_j}{\partial a_i} \bigg|_{\vec{a}=\vec{a}^{[l]}} = \frac{\partial}{\partial a_i} J(x_j, y_j) \bigg|_{\vec{a}=\vec{a}^{[l]}} \quad (***)$$

$$= L_i \cdot K(x_j - x_{0i}, y_j - y_{0i}) \cdot$$

$$G\left(E(x_j, y_j, \vec{a}^{[l]}), x_j - x_{0i}, y_j - y_{0i}\right)$$

where $$K(x, y) = \int\int H(\varsigma, \eta) e^{-i \cdot \frac{2\pi \cdot NA}{\lambda}(\varsigma x + \eta y)} d\varsigma d\eta$$

is the function of the coherent impulse response of the optical system;

$$G\left(E(x_j, y_j, \vec{a}^{[l]}), x_j - x_{0i}, y_j - y_{0i}\right) =$$

$$\text{Re} \int\int J(x_u, y_u) E(x, y, x_u, y_u, \vec{a}^{[l]}) \cdot e^{-i \cdot \frac{2\pi \cdot NA}{\lambda}(x_u(x-x_0)+y_u(y-y_0))} dx_u dy,$$

is the field weight function for the parameter component $a_i$;

$x_{0i}$ and $y_{0i}$ are the coordinates of the middle point of the i edge fragment, moved at the distance $a_i$ normal to the edge (see FIG. 4); and $E(x,y,x_u,y_u,\vec{a}^{[l]})$ is the process coherent field for the source point $(x_u, y_u)$ and l-stage of the iteration process. This field may be used for the process intensity calculation in the step 106.

When the length $L_i$ of the rectangle is greater than optical resolution limit $$\frac{\lambda}{NA}$$

(i.e., too long edge fragment), this fragment may be divided into parts with a length less than $$\frac{\lambda}{NA}$$

but with the same height $a_i$. The number of such parts is $$P_i = \left[\frac{L_i \cdot NA}{\lambda}\right] + 1, \text{ where} \left[\frac{L_i \cdot NA}{\lambda}\right]$$

notes the whole part of the division. Thus, the formula for the intensity derivative may be rewritten as follows:

$$\left.\frac{\partial J_j}{\partial a_i}\right|_{\vec{a}=\vec{a}^{[l]}} = \sum_{p=1}^{P_i} L_{ip} \cdot K(x_j - x_{0ip}, y_j - y_{0ip}) \cdot$$

$$G\!\left(E(x_j, y_j, \vec{a}^{[l]}), x_j - x_{0ip}, y_j - y_{0ip}\right)$$

where
$X_{0ip}$ and $y_{0ip}$ are coordinates of the middle point of the p-th part of the i-th edge fragment, moved at the distance $a_i$ along a direction normal to the edge; and $L_{ip}$ is the length of the p-th part of the i-th edge fragment.

After the cost function gradient calculation is performed in the step 110, the step of the next iteration $\lambda^{[l]}$ may be calculated 112. One may choose the largest component of the cost function gradient $i_{max}$ as the distance between ideal edge position and the process intensity contour $C^0$. This distance may be measured from the middle point at the $i_{max}$ edge fragment.

Then, new parameter values may be calculated 114, and the process 100 may then return to the step 104 and perform $(l+1)$-th iteration for the parameter component $\vec{a}^{[l+1]}$.

After the step 108, if the cost function for the new $\vec{a}^{[l+1]}$ decreases, the process may proceed to the step 110.

After the step 108, if the cost function for the new $\vec{a}^{[l+1]}$ increases, the step of iteration may be decreased (preferably the step $\lambda^{[l]}$ is divided by two) 116. Then, when the new step of iteration is not less than a minimum step of iteration, the process 100 may proceed to the step 114 and repeat the $(l+1)$-th iteration; and when the new step of iteration is less than the minimum step of iteration, parameter values for the minimum cost function may be set 118, and the process 100 may then proceed to step 120 in which the iteration process is stopped.

After the step 108, if the cost function does not change, the process 100 may directly proceed to the step 120 in which the iteration process is stopped.

It is understood that FIGS. 2 through 4 is used to help explain the present method and not intended as a structural limitation to the present invention. Those of ordinary skill in the art will understand that the present invention may be applied to various segments of an IC boundary without departing from the scope and spirit of the present invention.

It is to be noted that the above described embodiments according to the present invention on may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of software package. Such a software package may be a computer program product which employs a storage medium including stored computer code which is used to program a computer to perform the disclosed function and process of the present invention. The storage medium may include, but is not limited to, any type of conventional floppy disks, optical disks, CD-ROMS, magneto-optical disks, ROMs, RAMs, EPROMs, EEPROMs, magnetic or optical cards, or any other suitable media for storing electronic instructions.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for making mask edge corrections, comprising steps of:
   (a) providing initial parameter values and calibration parameter values;
   (b) performing coherent field calculation;
   (c) performing process intensity calculation; and
   (d) calculating a cost function, said cost function being defined as $$\Phi = \sum_i \Phi_i^2, \text{ wherein}$$

$$\Phi_i = \begin{cases} (J_{in}^i - C_{in}^0), & \text{if } J_{in}^i < C_{in}^0 \\ (J_{out}^i - C_{out}^0), & \text{if } J_{out}^i > C_{out}^0 \\ 0, & \text{in other cases} \end{cases} \quad \text{for dark background; and}$$

$$\Phi_i = \begin{cases} (J_{in}^i - C_{out}^0), & \text{if } J_{in}^i > C_{out}^0 \\ (J_{out}^i - C_{in}^0), & \text{if } J_{out}^i < C_{in}^0 \\ 0, & \text{in other cases} \end{cases} \quad \text{for clear background;}$$

where $J_{in}^i$ and $J_{out}^i$ are process intensity values at points $P_{in}^i$ and $P_{out}^i$, respectively, and $C_{out}^0 \leq C^0 \leq C_{in}^0$, $C^0$ being a cutline of a process intensity or aerial image contour, and $C_{out}^0$ and $C_{in}^0$ being some cutlines of said process intensity, which characterize an intensity gradient near said aerial image contour, wherein said cost function is used for optical proximity correction (OPC) purposes in making said mask edge corrections.

2. The method of claim 1, further comprising:
when a current cost function is less than a previous cost function, calculating a gradient component of said current cost function for i-coordinate $a_i$ as $$V_i[i] = \frac{\partial}{\partial a_i} \Phi(\vec{a}) \bigg|_{\vec{a}=\vec{a}[l]}.$$

3. The method of claim 2, wherein i-th gradient component for l-stage of an iteration process is represented as follows:

$$\frac{\partial}{\partial a_i} \Phi(\vec{a}) \bigg|_{\vec{a}=\vec{a}[l]} = 2 \sum_j (J_j - C_j) \frac{\partial J_j}{\partial a_i} \bigg|_{\vec{a}=\vec{a}[l]}$$

wherein $J_j = \{J_{in}^i \text{ or } J_{out}^j\}$ is a process intensity value corresponding to j control point, and $$\frac{\partial J_j}{\partial a_i}$$

is a first derivative of said process intensity $J_j$ for said parameter component $a_i$.

4. The method of claim 3, wherein when a size of a rectangle along a boundary edge is smaller than an optical resolution limit $$\frac{\lambda}{NA},$$

said first derivative of said process intensity $J_j$ for said parameter vector component $a_i$ is represented as follows:

$$\frac{\partial J_j}{\partial a_i} \bigg|_{\vec{a}=\vec{a}[l]} = \frac{\partial}{\partial a_i} J(x_j, y_j) \bigg|_{\vec{a}=\vec{a}[l]}$$
$$= L_i \cdot K(x_j - x_{0i}, y_j - y_{0i}) \cdot$$
$$G(E(x_j, y_j, \vec{a}^{[l]}), x_j - x_{0i}, y_j - y_{0i})$$

wherein $$K(x, y) = \int\int H(\varsigma, \eta) e^{-i \cdot \frac{2\pi \cdot NA}{\lambda}(\varsigma x + \eta y)} d\varsigma d\eta$$

is a function of a coherent impulse response of an optical system;

$$G(E(x_j, y_j, \vec{a}^{[l]}), x_j - x_{0i}, y_j - y_{0i}) =$$

-continued
$$\text{Re} \int\int J(x_u, y_u) E(x, y, x_u, y_u, \vec{a}^{[l]}) \cdot e^{-1 \cdot \frac{2\pi \cdot NA}{\lambda}(x_u(x-x_0)+y_u(y-y_0))} dx_u dy,$$

is a field weight function for said parameter component $a_i$;
$x_{0i}$ and $y_{0i}$ are coordinates of a middle point of i edge fragment, moved at a distance $a_i$ normal to said boundary edge; and $E(x, y, x_u, y_u, \vec{a}^{[l]})$ is a process coherent field for a source point $(x_u, y_u)$ and said l-stage of said iteration process.

5. The method of claim 2, further comprising:
when a length $L_i$ of a rectangle along an i-th edge fragment is greater than a optical resolution limit $$\frac{\lambda}{NA},$$

dividing said i-th edge fragment into $$P_i = \left[\frac{L_i \cdot NA}{\lambda}\right] + 1$$

parts, each part with a length less than $$\frac{\lambda}{NA}$$

and with a height $a_i$, wherein said first derivative of said process intensity $J_j$ for said parameter vector component $a_i$ is represented as follows:

$$\frac{\partial J_j}{\partial a_i} \bigg|_{\vec{a}=\vec{a}[l]} = \sum_{p=1}^{P_i} L_{ip} \cdot K(x_j - x_{0ip}, y_j - y_{0ip}) \cdot$$
$$G(E(x_j, y_j, \vec{a}^{[l]}), x_j - x_{0ip}, y_j - y_{0ip})$$

wherein $x_{0ip}$ and $y_{0ip}$ are coordinates of a middle point of p-th part of said i-th edge fragment, moved at a distance $a_i$ along a direction normal to said i-th edge fragment; and $L_{ip}$ is a length of said p-th part of said i-th edge fragment.

6. The method of claim 2, further comprising:
calculating a step of iteration, calculating new parameter values and returning to said step (b).

7. The method of claim 1, further comprising:
stopping an iteration process when a current cost function is equal to a previous cost function.

8. The method of claim 1, further comprising:
decreasing a step of iteration when a current cost function is greater than a preceding cost function.

9. An apparatus for making mask edge corrections, comprising:
(a) means for providing initial parameter values and calibration parameter values;
(b) means for performing coherent field calculation;
(c) means for performing process intensity calculation; and
(d) means for calculating a cost function, said cost function being defined as $$\Phi = \sum_i \Phi_i^2, \text{ wherein}$$

$$\Phi_i = \begin{cases} (J_{in}^i - C_{in}^0), & \text{if } J_{in}^i < C_{in}^0 \\ (J_{out}^i - C_{out}^0), & \text{if } J_{out}^i > C_{out}^0 \\ 0, & \text{in other cases} \end{cases} \text{ for dark background; and}$$

$$\Phi_i = \begin{cases} (J_{in}^i - C_{out}^0), & \text{if } J_{in}^i > C_{out}^0 \\ (J_{out}^i - C_{in}^0), & \text{if } J_{out}^i < C_{in}^0 \\ 0, & \text{in other cases} \end{cases} \text{ for clear background;}$$

where $J_{in}^i$ and $J_{out}^i$ are process intensity values at points $P_{in}^i$ and $P_{out}^i$, respectively, and $C_{out}^0 \leq C^0 \leq C_{in}^0$, $C^0$ being a cutline of a process intensity or aerial image contour, and $C^{out0}$ and $C_{in}^0$ being some cutlines of said process intensity, which characterize an intensity gradient near said aerial image contour, wherein said cost function is used for optical proximity correction (OPC) purposes in making said mask edge corrections.

10. The apparatus of claim 9, further comprising:
when a current cost function is less than a previous cost function, means for calculating a gradient component of said current cost function for i-coordinate $a_i$ as $$V_i[i] = \frac{\partial}{\partial a_i} \Phi(\vec{a}) \bigg|_{\vec{a}=\vec{a}^{[i]}}.$$

11. The apparatus of claim 10, wherein i-th gradient component for t-stage of an iteration process is represented as follows:

$$\frac{\partial}{\partial a_i} \Phi(\vec{a}) \bigg|_{\vec{a}=\vec{a}^{[i]}} = 2 \sum_j (J_j - C_j) \frac{\partial J_j}{\partial a_i} \bigg|_{\vec{a}=\vec{a}^{[i]}}$$

wherein $J_j = \{J_{in}^i \text{ or } J_{out}^j\}$ is a process intensity value corresponding to j control point, and $$\frac{\partial J_j}{\partial a_i}$$

is a first derivative of said process intensity $J_j$ for said parameter component $a_i$.

12. The apparatus of claim 11, wherein when a size of a rectangle along a boundary edge is smaller than an optical resolution limit $$\frac{\lambda}{NA},$$

said first derivative of said process intensity $J_j$ for said parameter vector component $a_i$ is represented as follows:

$$\frac{\partial J_j}{\partial a_i}\bigg|_{\vec{a}=\vec{a}^{[i]}} = \frac{\partial}{\partial a_i} J(x_j, y_j)\bigg|_{\vec{a}=\vec{a}^{[i]}}$$
$$= L_i \cdot K(x_j - x_{0i}, y_j - y_{0i}) \cdot$$
$$G(E(x_j, y_j, \vec{a}^{[i]}), x_j - x_{0i}, y_j - y_{0i})$$

wherein $$K(x, y) = \int\int H(\varsigma, \eta) e^{-i \cdot \frac{2\pi \cdot NA}{\lambda}(\varsigma x + \eta y)} d\varsigma d\eta$$

is a function of a coherent impulse response of an optical system;

$$G(E(x_j, y_j, \vec{a}^{[i]}), x_j - x_{0i}, y_j - y_{0i}) = \text{Re} \int\int J(x_u, y_u) E(x, y, x_u, y_u, \vec{a}^{[i]}) \cdot$$
$$e^{-i \cdot \frac{2\pi \cdot NA}{\lambda}\{x_u(x-x_0)+y_u(y-y_0)\}} dx_u dy_i$$

is a field weight function for said parameter component $a_i$;

$x_{0i}$ and $y_{0i}$ are coordinates of a middle point of i edge fragment, moved at a distance $a_i$ normal to said boundary edge; and $E(x, y, x_u, y_u, \vec{a}^{[l]})$ is a process coherent field for a source point $(x_u, y_u)$ and said l-stage of said iteration process.

13. The apparatus of claim 10, further comprising:
when a length $L_i$ of a rectangle along an i-th edge fragment is greater than a optical resolution limit $$\frac{\lambda}{NA},$$

means for dividing said i-th edge fragment into $$P_i = \left[\frac{L_i \cdot NA}{\lambda}\right] + 1$$

parts, each part with a length less than $$\frac{\lambda}{NA}$$

and with a height $a_i$, wherein said first derivative of said process intensity $J_j$ for said parameter vector component $a_i$ is represented as follows:

$$\frac{\partial J_j}{\partial a_i}\bigg|_{\vec{a}=\vec{a}^{[i]}} = \sum_{p=1}^{P_i} L_{ip} \cdot K(x_j - x_{0ip}, y_j - y_{0ip}) \cdot$$
$$G(E(x_j, y_j, \vec{a}^{[i]}), x_j - x_{0ip}, y_j - y_{0ip})$$

wherein $x_{0ip}$ and $y_{0ip}$ are coordinates of a middle point of p-th part of said i-th edge fragment, moved at a distance $a_i$ along a direction normal to said i-th edge fragment; and $L_{ip}$ is a length of said p-th part of said i-th edge fragment.

14. The apparatus of claim 10, further comprising:
means for calculating a step of iteration, calculating new parameter values and returning to said step (b).

15. The apparatus of claim 9, further comprising:
means for stopping an iteration process when a current cost function is equal to a previous cost function.

16. The apparatus of claim 9, further comprising:
means for decreasing a step of iteration when a current cost function is greater than a preceding cost function.

17. A computer-readable medium having computer-executable instructions for performing a method for making mask edge corrections, said method comprising steps of:
(a) providing initial parameter values and calibration parameter values;
(b) performing coherent field calculation;
(c) performing process intensity calculation; and
(d) calculating a cost function, said cost function being defined as $$\Phi = \sum_i \Phi_i^2, \text{ wherein}$$

$$\Phi_i = \begin{cases} (J_{in}^i - C_{in}^0), & \text{if } J_{in}^i < C_{in}^0 \\ (J_{out}^i - C_{out}^0), & \text{if } J_{out}^i > C_{in}^0 \text{ for dark background; and} \\ 0, & \text{in other cases} \end{cases}$$

$$\Phi_i = \begin{cases} (J_{in}^i - C_{out}^0), & \text{if } J_{in}^i > C_{out}^0 \\ (J_{out}^i - C_{in}^0), & \text{if } J_{out}^i < C_{in}^0 \text{ for clear background;} \\ 0, & \text{in other cases} \end{cases}$$

where $J_{in}^i$ and $J_{out}^i$ are process intensity values at points $P_{in}^i$ and $P_{out}^i$, respectively, and $C_{out}^0 \leq C^0 \leq C_{in}^0$, $C^0$ being a cutline of a process intensity or aerial image contour, and $C^{out0}$ and $C_{in}^0$ being some cutlines of said process intensity, which characterize an intensity gradient near said aerial image contour, wherein said cost function is used for optical proximity correction (OPC) purposes in making said mask edge corrections.

18. The computer-readable medium of claim 17, wherein said method further comprising:
when a current cost function is less than a previous cost function, calculating a gradient component of said current cost function for i-coordinate ai as $$V_i[i] = \frac{\partial}{\partial a_i} \Phi(\vec{a}) \bigg|_{\vec{a}=\vec{a}^{[i]}}.$$

19. The computer-readable medium of claim 18, wherein i-th gradient component for l-stage of an iteration process is represented as follows:

$$\frac{\partial}{\partial a_i} \Phi(\vec{a}) \bigg|_{\vec{a}=\vec{a}^{[i]}} = 2\sum_j (J_j - C_j) \frac{\partial J_j}{\partial a_i} \bigg|_{\vec{a}=\vec{a}^{[i]}}$$

wherein $J_j = \{J_{in}^i \text{ or } J_{out}^j\}$ is a process intensity value corresponding to j control point, and $$\frac{\partial J_j}{\partial a_i}$$

is a first derivative of said process intensity $J_j$ for said parameter component $a_i$.

20. The computer-readable medium of claim 19, wherein when a size of a rectangle along a boundary edge is smaller than an optical resolution limit $$\frac{\lambda}{NA},$$

said first derivative of said process intensity $J_j$ for said parameter vector component $a_i$ is represented as follows:

$$\frac{\partial J_j}{\partial a_i} \bigg|_{\vec{a}=\vec{a}^{[i]}} = \frac{\partial}{\partial a_i} J(x_j, y_j) \bigg|_{\vec{a}=\vec{a}^{[i]}}$$
$$= L_i \cdot K(x_j - x_{0i}, y_j - y_{0i}) \cdot$$
$$G\left(E\left(x_j, y_j, \vec{a}^{[i]}\right), x_j - x_{0i}, y_j - y_{0i}\right)$$

wherein $K(x, y) = \int\int H(\varsigma, \eta) e^{-i \cdot \frac{2\pi \cdot NA}{\lambda}(\varsigma x + \eta y)} d\varsigma d\eta$ is a function of a coherent impulse response of an optical system;

$$G\left(E\left(x_j, y_j, \vec{a}^{[i]}\right), x_j - x_{0i}, y_j - y_{0i}\right) =$$
$$\text{Re} \int\int J(x_u, y_u) E\left(x, y, x_u, y_u, \vec{a}^{[i]}\right) \cdot e^{-i \cdot \frac{2\pi \cdot NA}{\lambda}(x_u(x-x_0)+y_u(y-y_0))} dx_u dy_i$$

is a field weight function for said parameter component $a_i$;

$x_{0i}$ and $y_{0i}$ are coordinates of a middle point of i edge fragment, moved at a distance $a_i$ normal to said boundary edge; and $E(x, y, x_u, y_u, \vec{a}^{[l]})$ is a process coherent field for a source point $(x_u, y_u)$ and said l-stage of said iteration process.

21. The computer-readable medium of claim 18, wherein said method further comprising:
when a length $L_i$ of a rectangle along an i-th edge fragment is greater than a optical resolution limit $$\frac{\lambda}{NA},$$

dividing said i-th edge fragment into $$P_i = \left[\frac{L_i \cdot NA}{\lambda}\right] + 1$$

parts, each part with a length less than $$\frac{\lambda}{NA}$$

and with a height $a_i$, wherein said first derivative of said process intensity $J_j$ for said parameter vector component $a_i$ is represented as follows:

$$\frac{\partial J_j}{\partial a_i}\bigg|_{\vec{a}=\vec{a}^{[i]}} = \sum_{p=1}^{P_i} L_{ip} \cdot K(x_j - x_{0ip}, y_j - y_{0ip}) \cdot$$

$$G\left(E\left(x_j, y_j, \vec{a}^{[i]}\right), x_j - x_{0ip}, y_j - y_{0ip}\right)$$

wherein $x_{0ip}$ and $Y_{0ip}$ are coordinates of a middle point of p-th part of said i-th edge fragment, moved at a distance $a_i$ along a direction normal to said i-th edge fragment; and $L_{ip}$ is a length of said p-th part of said i-th edge fragment.

22. The computer-readable medium of claim 18, wherein said method further comprising:
calculating a step of iteration, calculating new parameter values and returning to said step (b).

23. The computer-readable medium of claim 17, wherein said method further comprising:
stopping an iteration process when a current cost function is equal to a previous cost function.

24. The computer-readable medium of claim 17, wherein said method further comprising:
decreasing a step of iteration when a current cost function is greater than a preceding cost function.

* * * * *